United States Patent [19]

Wenke

[11] Patent Number: 4,958,257
[45] Date of Patent: Sep. 18, 1990

[54] HEAT CONDUCTING INTERFACE FOR ELECTRONIC MODULE

[75] Inventor: Gerhard Wenke, Los Angeles, Calif.

[73] Assignee: Hughes Aircraft Company, Los Angeles, Calif.

[21] Appl. No.: 329,996

[22] Filed: Mar. 29, 1989

[51] Int. Cl.$^5$ .............................................. H05K 7/20
[52] U.S. Cl. ............................ 361/385; 165/104.33; 174/15.2; 361/415
[58] Field of Search .................. 357/82; 361/382–384, 361/385 X, 386–388, 412, 414, 415 X; 174/15.1, 15.2 X, 16.1; 165/185, 104.33, 104.26, 80.3, 80.4

[56] References Cited

U.S. PATENT DOCUMENTS

| | | | |
|---|---|---|---|
| 4,366,526 | 12/1982 | Lijoi et al. | 174/15.2 |
| 4,503,483 | 3/1985 | Basiulis | 174/15.2 |
| 4,718,163 | 1/1988 | Berland et al. | 361/415 |
| 4,777,561 | 10/1988 | Murphy et al. | 361/385 |
| 4,829,402 | 5/1989 | Gewebler | 361/388 |

*Primary Examiner*—Gerald P. Tolin
*Attorney, Agent, or Firm*—Leonard A. Alkov; Wanda K. Denson-Low

[57] ABSTRACT

A heat conducting interface unit for use in mounting an electronic module between cooling plates, includes an elongated flexible, U-shaped, highly heat conductive metallic heat exchange member adapted to receive a condenser end of the electronic module. The heat exchange member is located within a housing which provides liquid coolant chambers on the outside walls of the heat exchange member. The coolant is supplied under pressure through inlets in the housing from corresponding ports in the cooling plates. The pressure in the coolant chamber urges the flexible metallic heat exchange member into increased contact pressure with the condenser portion of the electronic module, reducing the thermal resistance across the contact interface, increasing the rate of heat transfer to the cold plate, and clamping the module in position. The heat exchange member covers the entire surface of the condensor to maximize heat transfer. It also provides a simple structure and a short thermal path to the coolant.

11 Claims, 2 Drawing Sheets

HEAT CONDUCTING INTERFACE FOR ELECTRONIC MODULE

BACKGROUND OF THE INVENTION

1. Field of the Invention:

This invention relates generally to improvements in apparatus for thermal management of electronic modules, and more particularly relates to a self-adjusting heat transfer system for temperature control and automatic clamping of electronic modules.

2. Prior Art:

Temperature control of electronic modules, particularly in advanced avionics systems, can pose a problem when there is high power consumption and high heat production from circuit cards that have electronic components mounted in a high density configuration. A high efficiency heat removal system is often neccesary in order to provide a proper temperature environment in the range of about 20° to 100° C.

Air cooling systems which force air across the modules or draw air around the modules have been used in the past. However, circulation of a liquid coolant to cool the modules is often a more efficient method of heat removal. Such systems typically route a liquid coolant through cavities in the interior of cold plates that support circuit card racks which hold the modules, with means for communicating heat from the electronic components to the racks. Heat pipes mechanically clamped to the circuit card rack, and flexible wall or pressurized bellows-type cooling plates bearing against an edge of a circuit card rack have been used for communicating heat from the electronic components. Internal heat pipes in the body of the circuit card, in close thermal communication with the electronic components on the card, and in thermal communication with the ends of the circuit card body, are also known. While these devices have served their purpose, there remains a continuing desire for further improvements in terms of a device which is simpler in construction, more efficient at thermal management, and designed to provide a shorter thermal path between the module and the coolant.

It has also been known that thermal resistance at the interface between two bodies having different temperatures is dependent upon the contact pressure at the interface. The thermal conductivity increases, and the thermal resistance decreases, as the contact pressure increases at the interface. It would therefore be desirable to provide an interface for electronic modules that decreases the thermal resistance of the interface.

Breakage of modules has also been a problem. Often the electrical and mechanical connections in the circuit card rack are configured in a way which makes it difficult to install the cards in the rack or remove them from the rack without applying substantial force. Cards have been known to break or be damaged when subjected to this force, resulting in increased expense and prolonged system down-time. It would be desirable to provide an automatic clamping mechanism to lock circuit card modules into the rack during operation, and to automatically unclamp them during non-operation, so as to allow easy removal and insertion of the modules for routine maintenance and assembly procedures. The present invention fulfills all of these needs.

SUMMARY OF THE INVENTION

Briefly, and in general terms, the present invention provides a self-adjusting heat conducting interface for temperature control and automatic clamping of electronic modules to cold plates, which is simple to manufacture, efficient at heat removal, and capable of providing a short thermal path from the module to the cold plate. The interface includes a flexible, generally U-shaped, highly heat conductive metallic heat exchange member, adapted to receive the condensor end of an electronic module, and cover the entire surface of the condensor. The U-shaped heat exchange member is located within a housing which defines liquid coolant chambers on the outside walls of the heat exchange member. Liquid coolant is supplied under pressure through inlets in the housing from ports in the cold plates. The pressure in the coolant chamber forces the flexible heat exchange member into increased contact pressure with the condensor portion of the electronic module, thereby reducing the thermal resistance across the contact interface and increasing the rate of heat transfer from the module to the cold plate.

The condensor ends of the modules are designed to initially fit in the flexible heat exchange member with a low contact pressure, for particularly easy removal and insertion of modules during maintenance and installation operations. As the pressure of the coolant in the coolant chambers is increased, the flexible walls of the heat exchange member are urged into engagement with the condensor ends of the module to automatically clamp the module into the rack.

More specifically, and in a presently preferred embodiment, by way of example and not necessarily by way of limitation, the heat conducting interface comprises a housing forming a liquid coolant circulation chamber in communication with a heat sink, and includes a flexible, highly heat conductive metallic heat exchange member adapted to receive the condensor ends of an electronic module. The heat exchange member is mounted in the housing to flex in response to elevated pressure of the liquid coolant in the circulation chamber so as to cause an increase in the contact pressure at the interface between the heat exchange member and the electronic module condensor. The heat exchange member preferably has a generally U-shaped configuration two opposite planar side walls defining a channel for receiving the module condensor. The housing preferably provides a liquid coolant circulation chamber on the outer sides of each side wall. Spring-like corners at the ends of the walls provide flexibility to the heat exchange structure. In a preferred embodiment, the outer surfaces of the planar walls include finstock which increases radiation of heat to the liquid coolant circulation chamber.

These and other objects and advantages of the invention will become apparent from the following more detailed description, when taken in conjunction with the accompanying drawings, illustrating by way of example illustrative embodiments of the invention.

DETAILED DESCRIPTION OF THE PREFERRED EMBODIMENT

Figure 1:
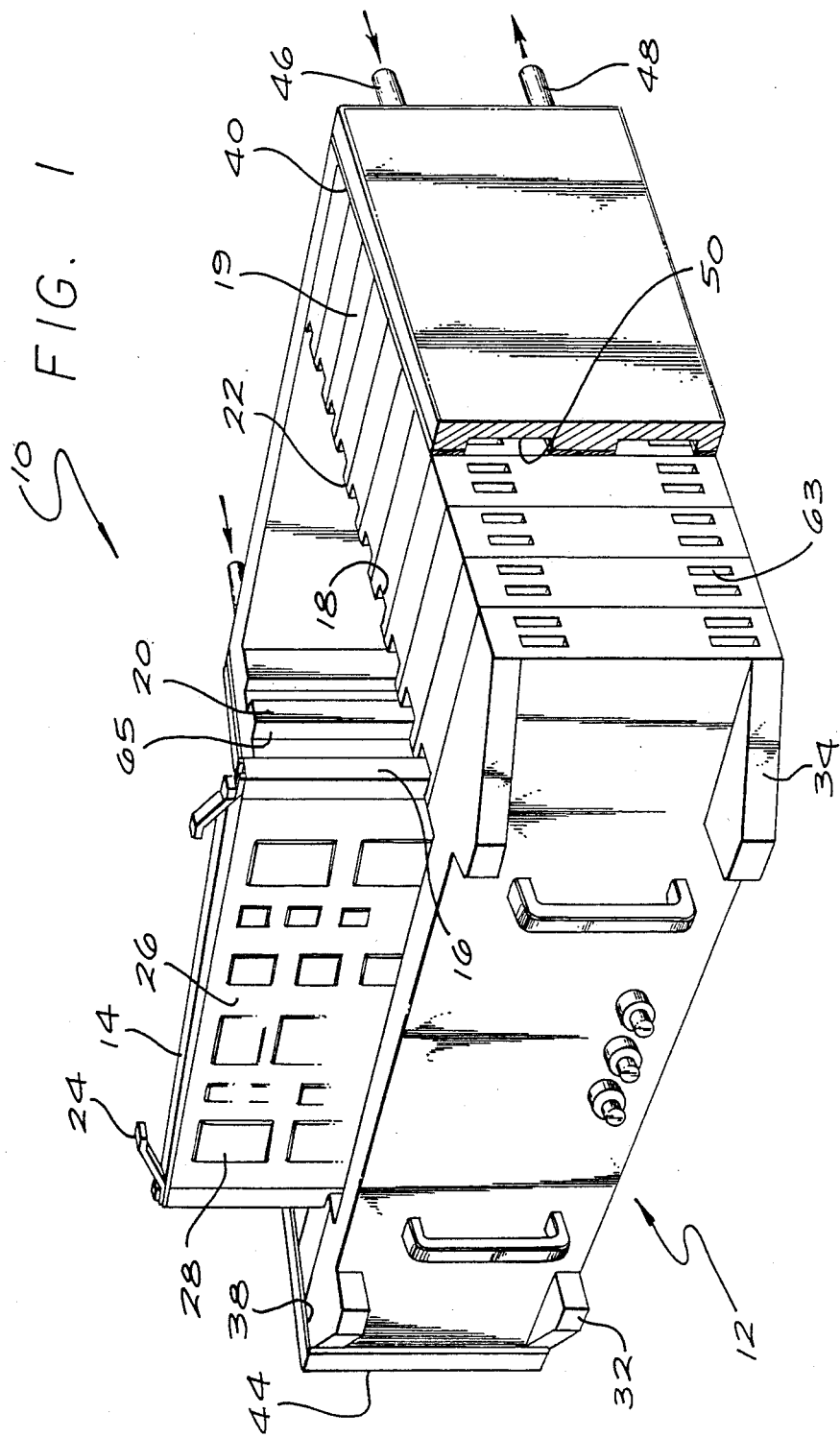
FIG. 1 is a perspective view of heat conducting interface units embodying novel features of the present invention and showing the units used in a circuit card rack partly cut away in section for purposes of illustration.

As is shown in the drawings for purposes of illustration, the invention is embodied in a heat conducting interface unit for electronic modules mounted in a circuit card rack. An electronic module typically has a heat pipe between two circuit boards that carry electronic components which can generate heat during normal operations. The heat pipe conducts heat to the condensor edges of the module.

In accordance with the present invention, the heat conducting interface unit operates in conjunction with a liquid coolant supply manifold in cold plates on either side of the circuit card rack, and includes a liquid coolant circulation chamber connected to the liquid coolant supply. A flexible, metallic, highly heat conductive heat exchange member is positioned in the interface unit within the liquid coolant circulation chamber so that liquid coolant flows along the outer surface of the heat exchange member. The heat exchange member is adapted to receive and conduct heat from the condensor ends of the electronic module. The interface unit can simultaneously clamp and cool a standard electronic module by using liquid coolant, allowing in certain embodiments a heat transfer of up to 100 watts on each side of the module, for a total of 200 watts per module.

To efficiently utilize the heat transfer characteristics of the liquid coolant, the heat exchange member flexes in response to the pressure of the liquid coolant to assure close contact with the surface of the condensor ends of the module. The pressure of the liquid coolant on the flexible heat exchange member also clamps of the module into the rack. The working surface area of the heat exchange member is preferably increased by the use of finstock which extends into the liquid coolant chamber, thereby allowing the liquid coolant to flow through the finstock and assuring maximum heat transfer between the heat exchange member and the coolant.

In accordance with a preferred embodiment of the invention, there is provided a heat conducting interface for an electronic module used in a mounting structure having a heat sink associated therewith, the electronic module including a body supporting one or more electronic components and heat pipe means associated with the body in thermal communication with the components, the heat pipe means containing a heat transfer fluid, and heat condensor means associated with at least one end of the body in thermal communication with the heat pipe means, the heat conducting interface comprising a housing having an inlet and outlet in fluid communication with a liquid coolant supply, a flexible, highly heat conductive heat exchange member adapted to receive the heat condensor means and having at least one highly heat conductive panel, the heat exchange member and housing in combination forming at least one liquid coolant circulation chamber in thermal communication with the flexible highly heat conductive member, whereby flexible movement of the flexible highly heat conductive heat exchange member occurs in response to elevated fluid pressure within the liquid coolant circulation chamber.

As is shown in FIG. 1, an electronic module 10 may be inserted into a typical circuit card rack 12 in an advanced avionics system. The module has a planar body 14 with condensor ends 16 adapted to be received within vertical grooves 18 formed in individual interface units 19 positioned to define at least one of the opposite interior walls 20 and 22 of the rack. Handles 24 at the corners of the upper longitudinal edge of the module facilitate installation and removal of the module from the rack. Circuit cards 26 with a variety of electronic components 28 are mounted on one or both surfaces of the module body.

The circuit card rack 12 is typically mounted in a drawer-like fashion in a support frame which includes cold plates as side members 40 and 44. Liquid coolant flows as indicated by arrows 46 and 48 through interior manifold passageways 50 in the cold plates.

Figure 2:
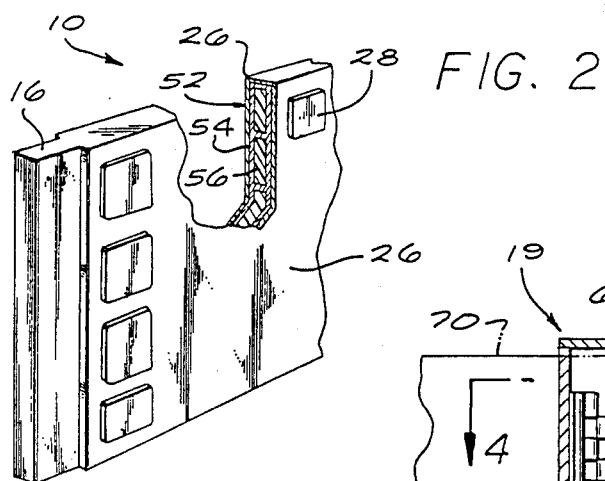
FIG. 2 is a fragmentary perspective cut away view of the electronic module shown in FIG. 1.

As is illustrated in FIG. 2, a plurality of heat pipes 52 extend longitudinally through the body of each module 10. The heat pipe structure typically includes a conduit 54, preferably made of stainless steel and lined with a wick material 56. A working fluid in the conduit has an evaporation/condensation cycle which carries heat from the electronic components 28 to the condensor ends of the module. A typical working fluid may be Freon 12 or Freon 25. As will be apparent, heat from the electronic components causes working fluid to evaporate and move through the conduit to the condensor end of the module. The vapor condenses on the cooler surfaces of the condensor, and then returns to the location where heat is received by the capillary action of the wick material.

Figure 3:
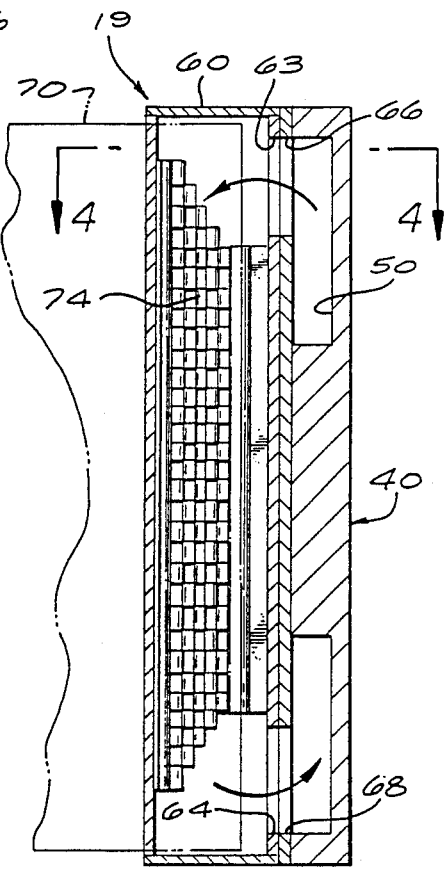
FIG. 3 is an enlarged side elevation sectional view of one of the interface units shown in FIG. 1.
Figure 4:
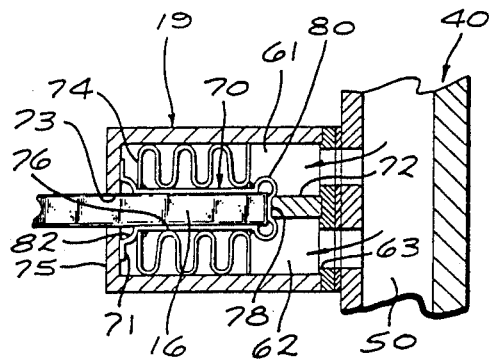
FIG. 4 is an enlarged cross-sectional view taken along line 4—4 of FIG. 3.

As is illustrated in FIGS. 3 and 4, an individual interface unit preferably comprises a housing 60, which in a currently preferred embodiment is made of stainless steel. The housing contains chambers 61 and 62 for liquid coolant. The coolant enters the housing at one end through coolant inlets 63 and exits through outlets 64 at the other end of the housing. The liquid coolant may be a conventional dielectric liquid coolant, such as hydrocarbon oil, askarel or silicone oils. A currently preferred coolant is Coolanol, available from Monsanto Chemical Company. The liquid coolant is supplied at an elevated pressure, typically about 50 psi, from the cold plate supply manifold, through a cold plate outlet 66. After flowing through the liquid coolant chamber in the interface unit, the liquid coolant returns to the cold plate manifold through a cold plate inlet 68.

The heat exchange member 70 is preferably formed from a longitudinal thin metal sheet having a generally U-shaped cross-section, which forms a channel adapted to receive a condensor edge of the electronic module. The heat exchange member is preferably made from 0.010 inch thick beryllium copper sheet, shaped to allow for flexing under pressure from the liquid coolant, to thereby make particularly close contact with the condensor surface and provide a short thermal path between the condensor and the coolant. The heat exchange member has a flange 71 at the open end of the channel which is preferably brazed to the inner surface of the stainless steel housing on opposite sides of a lengthwise vertical opening 73 formed in the inward facing wall 75 of the housing. The heat exchange member is also preferably braced at the closed end or base of the channel by a stop member 72 formed in the housing which extends inwardly in a direction parallel to the channel and abuts the base of the channel. The heat exchange member extends into the liquid coolant chamber, and along with the stop member, divides the housing into the two side-by-side coolant chamber 61 and 62. Finstock 74, preferably made of copper, is also preferably brazed to the surface of the beryllium copper heat exchange member exposed to the liquid coolant. The side walls 76 of the heat exchange member run the entire length and width of the condensor surface to maximize heat transfer. The side walls also are preferably joined to an end wall 78 at the base of the channel by three-quarter rounded, protruding outside corner segments 80 which act as springs facilitating the inward and outward flexing of the side walls relative to the condensor surface. The flange 71 is also joined to the side walls 76 of the heat exchange member by quarter round inside corner segments 82 which also act as springs. In a preferred embodiment, the heat exchange member 70, including the side walls 76, end wall 78, flanges 71 and corner segments 80 and 82, is formed in a one-piece construction.

From the foregoing, it will also be appreciated that the interface apparatus according to the invention provides an efficient heat transfer structure and maximizes use of the heat transfer characteristics of the liquid coolant. The flexible heat exchange member assures close and complete contact with the condensor edges of the electronic module and provides a short thermal path to the coolant. The pressure of the liquid coolant on the flexible heat exchange member also provides automatic firm clamping of the module into the circuit card rack, along with simultaneous heat removal from the module.

Although a particular form of the invention has been described and illustrated, it will be apparent that various modifications and embodiments within the ability of those skilled in the art can be made without the exercise of the invention faculty and without departing from the spirit and scope of the invention.

I claim:

1. Heat conducting interface apparatus including an electronic module having a body supporting one or more electronic components, heat pipe means within the body in thermal communication with said components, and condensor means at least at one end of the body in thermal communication with the heat pipe means, said interface apparatus comprising:
    a housing having inlet means and outlet means in fluid communication with a liquid coolant supply;
    a flexible, highly heat conductive heat exchange member within said housing receiving said condensor means and having at least one highly heat conductive panel, said heat exchange member and said housing in combination forming at least one liquid coolant circulation chamber in thermal communication with said heat exchange member whereby flexible movement of said heat exchange member occurs in response to elevated fluid pressure within said liquid coolant circulation chamber, wherein said heat exchange member comprises two highly heat conductive panels separating two liquid coolant circulation chambers in said housing.

2. Apparatus as set forth in claim 1, wherein said coolant circulation chamber is in direct contact with said heat exchange member.

3. Apparatus as set forth in claim 1, wherein said heat exchange member includes a transverse panel between said first and second panel members, and said housing includes a stop member extending into contact with said transverse panel to further separate said two liquid coolant circulation chambers.

4. Apparatus as set forth in claim 1, wherein said heat exchange member comprises a longitudinal thin metallic sheet having a U-shaped transverse section.

5. Apparatus as set forth in claim 4, wherein said metallic sheet has opposed side walls joined to a transverse base wall by spring members.

6. Apparatus as set forth in claim 1, wherein said heat exchange member includes spring members.

7. Apparatus as set forth in claim 1, wherein said heat exchange member is comprised of a beryllium copper alloy.

8. The apparatus as set forth in claim 7, wherein said beryllium copper alloy is formed in a thin sheet approximately 0.010 inches thick.

9. Apparatus as set forth in claim 1, wherein said heat exchange member includes highly heat conductive finstock in thermal communication with said liquid coolant circulation chamber.

10. Apparatus as set forth in claim 1, wherein said heat exchange member is constructed and arranged to provide a thermal contact interface with the entire surface of said condensor means and having a thermal resistance which varies as a function of said fluid pressure within said liquid coolant circulation chamber.

11. Apparatus as set forth in claim 1, wherein said flexible movement of said heat exchange member produces simultaneous cooling and clamping of said electronic module.

* * * * *